(12) United States Patent
Härer et al.

(10) Patent No.: US 7,245,125 B2
(45) Date of Patent: Jul. 17, 2007

(54) MAGNETIC RESONANCE IMAGING APPARATUS AND METHOD WHEREIN STREAK ARTIFACTS ARE MINIMIZED IN MODULAR K-SPACE SCANNING

(75) Inventors: Wolfgang Härer, Möhrendorf (DE); Peter Speier, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 190 days.

(21) Appl. No.: 10/921,021

(22) Filed: Aug. 18, 2004

(65) Prior Publication Data

US 2005/0073303 A1   Apr. 7, 2005

(30) Foreign Application Priority Data

Aug. 18, 2003   (DE)   ............................... 103 37 932

(51) Int. Cl.
*G01V 3/00*   (2006.01)
(52) U.S. Cl. ........................ 324/310; 324/307; 324/309; 324/318
(58) Field of Classification Search ...................... None
See application file for complete search history.

(56) References Cited

U.S. PATENT DOCUMENTS

| | | | |
|---|---|---|---|
| 5,122,747 A * | 6/1992 | Riederer et al. ............. | 324/309 |
| 5,243,284 A | 9/1993 | Noll ........................... | 324/309 |
| 5,485,086 A * | 1/1996 | Meyer et al. ................ | 324/307 |
| 5,539,313 A * | 7/1996 | Meyer ......................... | 324/309 |
| 5,604,435 A * | 2/1997 | Foo et al. .................... | 324/309 |
| 5,650,723 A * | 7/1997 | Meyer ......................... | 324/309 |
| 5,810,726 A | 9/1998 | Van Vaals et al. .......... | 600/410 |
| 5,933,006 A | 8/1999 | Rasche et al. ............... | 324/307 |
| 6,281,681 B1 * | 8/2001 | Cline et al. .................. | 324/310 |
| 6,400,152 B1 * | 6/2002 | Cline et al. .................. | 324/309 |
| 6,515,477 B1 * | 2/2003 | Tasaka et al. ............... | 324/309 |
| 6,630,828 B1 * | 10/2003 | Mistretta et al. ............ | 324/309 |

(Continued)

FOREIGN PATENT DOCUMENTS

DE   198 59 491 A1   7/2000

OTHER PUBLICATIONS

Pipe "The Use of Parallel Imaging with PROPELLER DWI," Pipe, Proc. Intl. Soc. Mag. Reson. Med. 11 (Jul 10-16, 2003), pp. 66.*

(Continued)

*Primary Examiner*—Brij Shrivastav
*Assistant Examiner*—Tiffany A. Fetzner
(74) *Attorney, Agent, or Firm*—Schiff Hardin LLP

(57) ABSTRACT

In a method and MRI apparatus for the minimization of streak artifacts in modular k-space scanning in magnetic resonance imaging, an odd integer k-space scanning module number $N_\varphi = 2n+1$ is defined that defines the number of incrementally rotated repeated modules of the k-space scanning process, a slice selection gradient selects any slice in the range of the object to be examined, and data for all $N_\varphi$ angle-oriented k-space scanning modules in the selected slice acquired such that each k-space scanning module has an azmuthal distance of $$\frac{\Delta \varphi}{2} = \frac{360°}{2N_\varphi}$$

from both adjacent projections, with the direction of the scanning of the adjacent k-space scanning modules alternating.

9 Claims, 7 Drawing Sheets

U.S. PATENT DOCUMENTS

| | | | | |
|---|---|---|---|---|
| 6,995,560 | B2* | 2/2006 | Duerk et al. | 324/310 |
| 7,002,342 | B2* | 2/2006 | Duerk et al. | 324/307 |
| 7,023,207 | B1* | 4/2006 | Gaddipati et al. | 324/309 |
| 7,042,215 | B2* | 5/2006 | Moriguchi et al. | 324/307 |
| 2002/0002331 | A1* | 1/2002 | Cline et al. | 600/410 |
| 2005/0073303 | A1* | 4/2005 | Harer et al. | 324/307 |
| 2006/0028206 | A1* | 2/2006 | Zhang et al. | 324/309 |

OTHER PUBLICATIONS

Pipe "Periodically Rotated Overlapping Parallel Lines with Enhanced Reconstruction (PROPELLER) MRI: Application to Motion Correction," Pipe, Proc. Intl. Magn. Reson. Med. 7 (1999), p. 242.*

Pipe "Multishot Diffusion Weighted FSE with PROPELLER", Proc. Intl. Magn. Reson. Med. 9 (2001), p. 166.*

Pipe et al., article "Turboprop- An Improved PROPELLER Sequence for Diffusion Weighted MRI," Pipe, Proc. Intl. Soc. Mag. Reson. Med. 10 (2002).*

"Recent Advances in Image Reconstruction, Coil Sensitivity Calibration, and Coil Array Design for SMASH and Generalized Parallel MRI," Sodickson et Magnetic Resonance Materials in Physics, Biology and Medicine, vol. 13 (2002), pp. 158-163.*

"Advances in Sensitivity Encoding with Arbitrary k-space Trajectories," Pruessmann et al. Mag. Res. in Med., vol. 46 (2001) Danes 638-651.*

"Reduced Circular Field-of-View Imaging" Scheffler et al., Magnetic Resonance in Medicine, vol. 40 (1998) pp. 474-480.

"Time-Resolved Contrast-enhanced Imaging with Isotropic Resolution and Broad Coverage Using an Undersampled 3D Projection Trajectory," Barger et al., Magnetic Resonance in Medicine, vol. 48 (2002), pp. 297-305.

"Motion Correction with PROPELLER MRI: Application to Head Motion and Free-Breathing Cardiac Imaging," Pipe, Magnetic Resonance in Medicine, vol. 42 (1999) pp. 963-969.

"High Spatial Resolution EPI Using an Odd Number of Interleaves," Buonocore et al, Magnetic Resonance in Medicine, vol. 41 (1999) pp. 1199-1205.

* cited by examiner

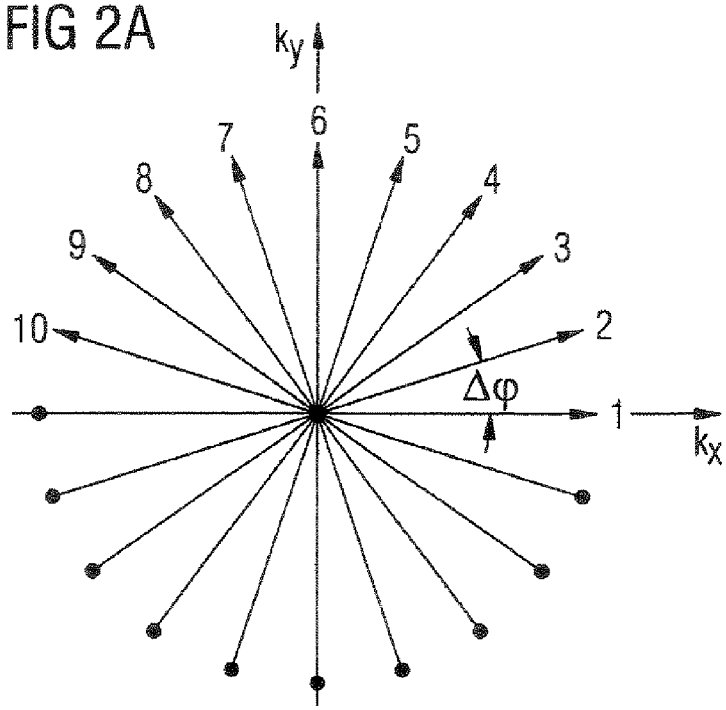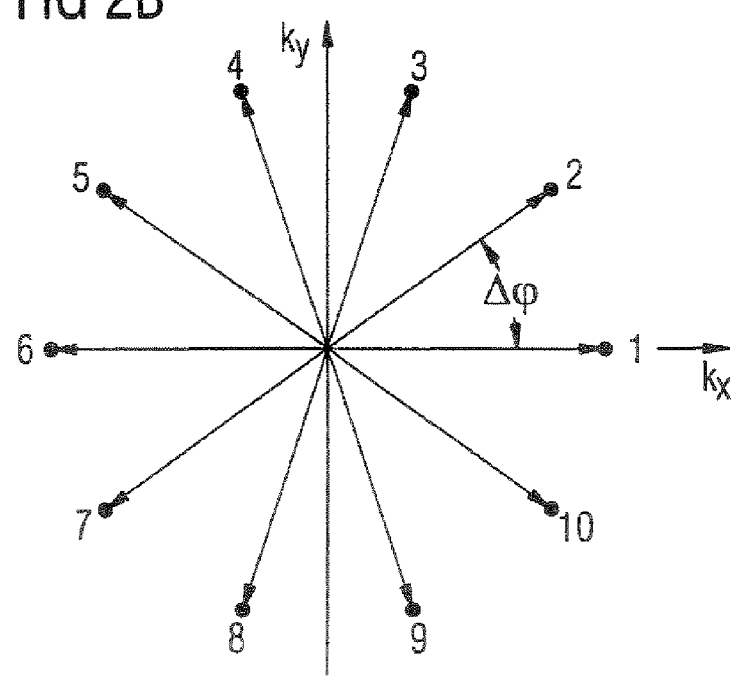

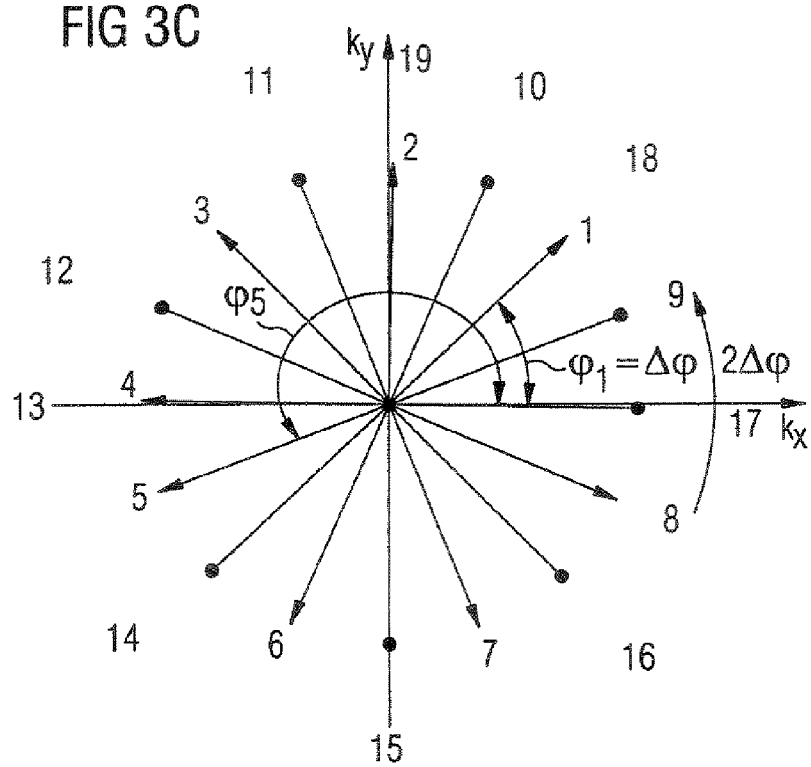
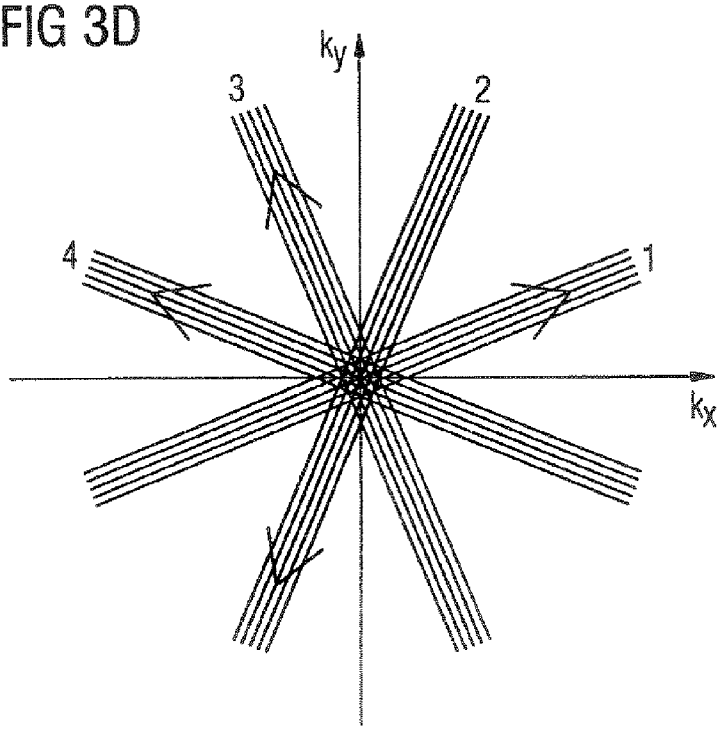

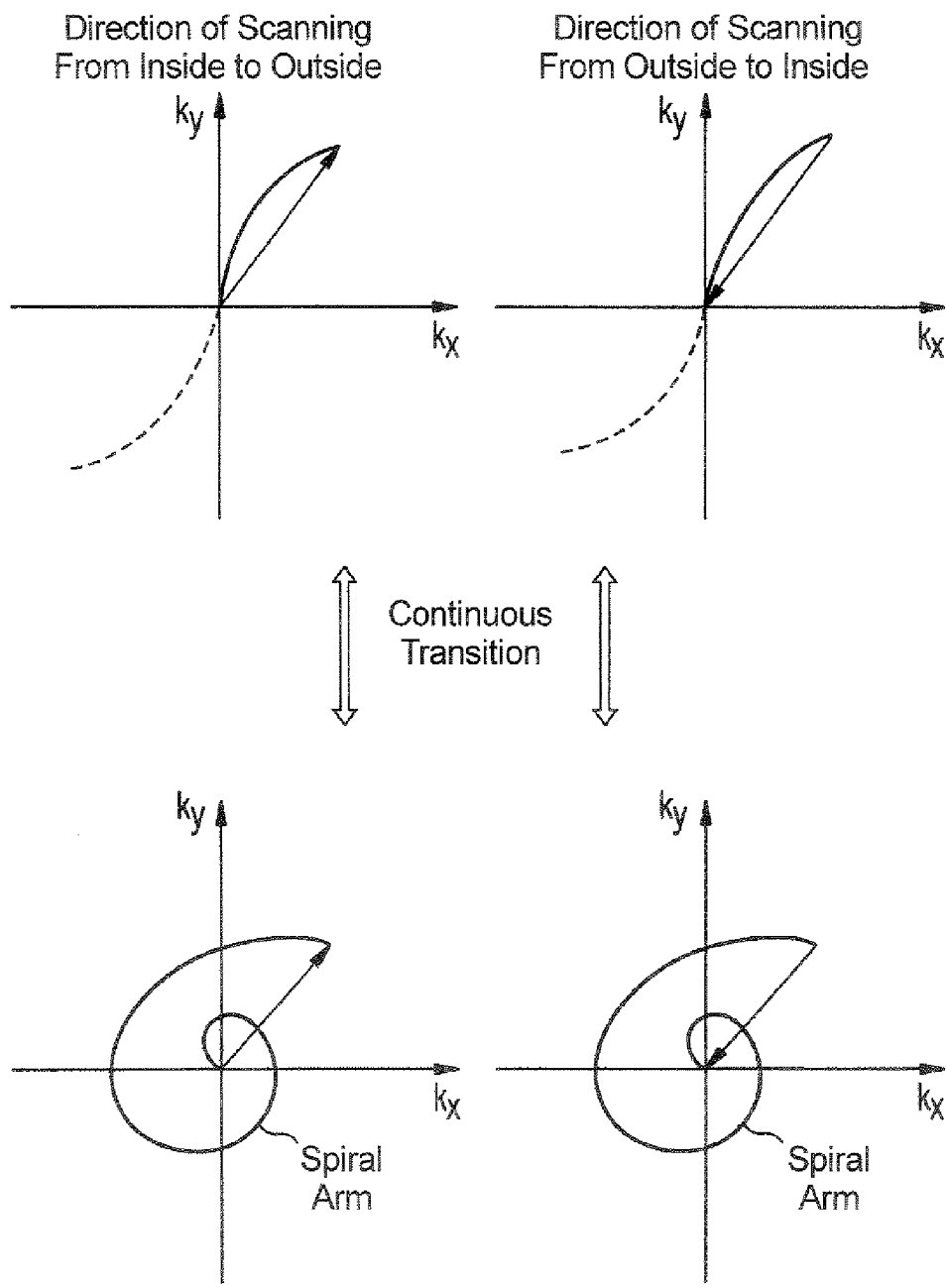

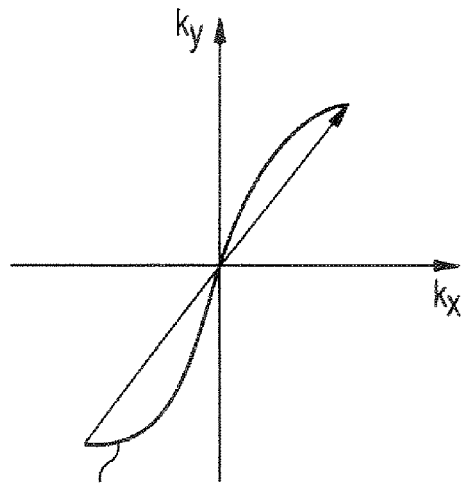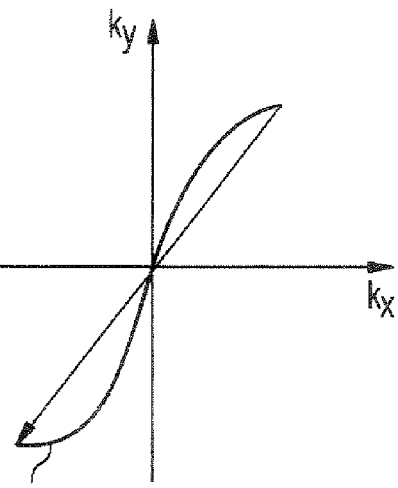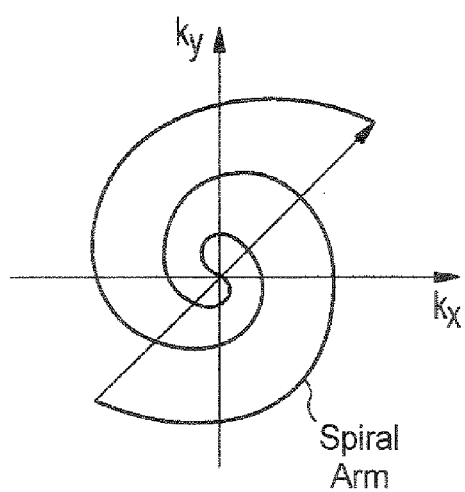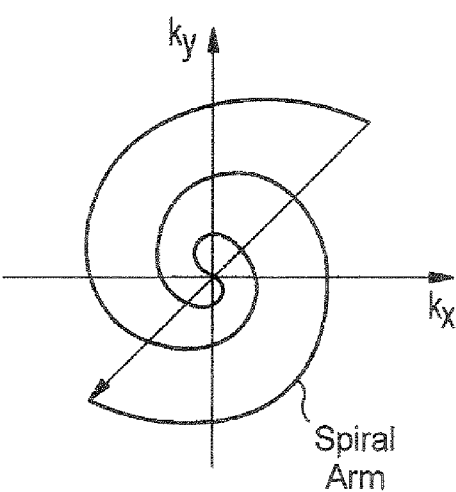
FIG 3F
Direction of Scanning From Inside to Outside
Direction of Scanning From Outside to Inside
Continuous Transition
Spiral Arm
Spiral Arm $\Delta\varphi$

MAGNETIC RESONANCE IMAGING APPARATUS AND METHOD WHEREIN STREAK ARTIFACTS ARE MINIMIZED IN MODULAR K-SPACE SCANNING

BACKGROUND OF THE INVENTION

1. Field of the Invention

The present patent generally relates to magnetic resonance tomography (or magnetic resonance imaging—MRI), which is used in the medical field for examining patients. The present invention particularly relates to a magnetic resonance imaging device and to a method to operate such device, in which star-shaped streak artifacts, which arise due to radial and/or spiral-type undersampling of k-space, are minimized without simultaneously increasing other factors that contribute to the degradation of the image.

2. Description of the Prior Art

Magnetic resonance imaging is based on the physical phenomena of nuclear spin resonance and has been successfully used in medicine and biophysics for over 15 years. This examination method subjects the object of examination to a strong, constant magnetic field. This exposure aligns the previously randomly oriented nuclear spins in the object. Radio-frequency energy can excite these "ordered" nuclear spins to a certain oscillation. This oscillation produces in the magnetic resonance imaging system the actual signal to be measured, which is received by suitable receiver coils, Using inhomogeneous magnetic fields, generated by gradient coils, the object can be spatially coded in all three directions in space. This method allows one to freely select the layer to be imaged, which means that sectional images of the human body can be recorded in all directions. Magnetic resonance imaging, as a sectional imaging method used in medical diagnostics, is primarily regarded as a non-invasive examination method with versatile contrast capabilities. Due to its outstanding capability to display soft tissue, magnetic resonance imaging has developed into an imaging procedure that is far superior to X-ray computed tomography (CT). Currently, magnetic resonance imaging focuses on the use of spin echo and gradient echo sequences that achieve an excellent image quality with measurement times in the magnitude of minutes.

The continuing technical development of the components of magnetic resonance imaging and the introduction of fast imaging sequences have opened more new fields in medicine to the beneficial use of magnetic resonance imaging. Examples of these applications include real-time imaging to support minimally invasive surgical interventions, functional imaging in neurology, and perfusion measurement in cardiology.

Despite these positive characteristics, magnetic resonance imaging must be characterized as a relatively insensitive imaging technique, because—in spite of the many nuclei in, for example, a human body—the signal-producing nuclear magnetic moment is still very small, Therefore, in practical application it is necessary to find an acceptable compromise between the duration of the measurement and the image quality (resolution and contrast). Particularly in the case of objects to be examined that are moving (e.g., in real-time imaging or in applications for cardiology), a balance must be found between the temporal resolution (motion sharpness) and the image quality. Therefore, in many cases, only a portion of the data that are required for an artifact-free image are recorded, which is generally called "undersampling," and, ultimately, this results in images with artifacts. The kind of artifact in the resulting image depends on the selected k-space trajectory.

In magnetic resonance imaging, the k-space trajectory defines the data recording, i.e., the sequence of the data acquisition in k-space (frequency domain). The MRI image in the image domain is linked with the MRI data in the k-space by means of the Fourier transformation. The spatial encoding of the object, which spans k-space, occurs by means of gradients that extend in all three directions in space. These directions represent the slice selection (defines a slice in the object to be scanned, usually along the z axis), frequency encoding (defines a direction in the slice, usually along the x axis), and phase encoding (defines the second dimension within the slice, usually along the y axis). Depending on the combination, i.e., switching of the three gradients in the imaging sequence, the scanning of k-space can occur in Cartesian coordinate system (also called linear scanning) or in the cylindrical coordinate system, i.e., spiral scanning.

In order to acquire data for a slice of the object to be examined in the Cartesian system, an imaging sequence for different values of the phase encoding gradient, e.g., $G^y$, is repeated N times, wherein for each repetition, the frequency of the nuclear resonance signal is scanned, digitized, and stored by a $\Delta t$-clocked ADC (analog digital converter) N times in equidistant time steps $\Delta t$ in the presence of the readout gradient $G^x$. In this way, a numerical matrix is created line by line (matrix in k-space, also called the k-matrix) with N×N data points (a symmetrical matrix with N×N points is only an example; asymmetrical matrices also can be produced). Using Fourier transformation, an MR image of the scanned slice is reconstructed with a resolution of N×N pixels.

It is also possible to fill (make entries in) k-space by a projection reconstruction procedure, i.e., to fill k-matrix by means of radial scanning, A radial scanning trajectory in k-space includes of sections of the projection (straight) lines through the point of origin of k-space, which form an angle $\Delta\phi$ with each other. Each projection line corresponds to one Fourier-transformed (parallel) projection of the object to be imaged. No phase encoding occurs when the scanning is done using projection lines.

The projection itself exists only in the image domain and is composed of the entirety of all line integrals through the object to be imaged along the defined projection direction. This projection in the image space is reflected by a straight line in k-space—the aforementioned projection line—which intersects its center and is orthogonal to the projection direction. The projection line is first unidirectional, because—from a mathematical point of view—it possesses no preferred direction. The function values on this line—just like in Cartesian scanning—are obtained by Fourier transformation of the projection values. In order to be able to determine, in an MRI procedure, the k-space values pertaining to a projection, the undirectional projection line must be passed and scanned in time, which is achieved by suitable control of the MRI device. Thus, using the measurement process, the projection line acquires a direction. This newly directed line is called the directed projection line.

The directed projection line can once again be divided into an incoming spoke and an outgoing spoke.

Thus, the same projection can be measured with two directed projection lines by reversing the direction of passing, i.e., the incoming and the outgoing spokes are mutually exchanged. Due to physical interference effects—which will be explained in more detail below—the measured function values on the line, i.e., the spoke, depend on the direction of passing. The present invention deals with the minimization of such interference effects with a simultaneous minimal measurement cost, in relation to the entire scanning of the object to be examined with a multitude of projection lines.

During the readout, the data of a projection line, i.e., of a single k-space line, is frequency-encoded by means of a gradient. In the acquisition process for projection reconstruction, a gradient is used that does not scan line-by-line as in the Cartesian system, but rather rotates around the sample. In this manner, in each measurement step the corresponding projection from a certain direction through the entire sample is obtained and thus a typical data set for the projection reconstruction in k-space, as is shown in FIG. 4. Each projection in k-space forms, with each neighbor, an angle $\Delta\phi$, which is produced by rotating the readout gradient.

Since the image acquisition time increases with the number of the measured k-space lines and in many cases is proportional, most procedures shorten the image acquisition time by the reduction of the number of the measured k-space lines, which is the previously referenced "undersampling". Such procedures inevitably result in image artifacts. In Cartesian scanning, it is the phase encoding that is reduced; in radial scanning, the number of projection is reduced.

The so-called "aliasing" artifacts predominate in Cartesian scanning, whereas in radial and spiral-type undersampling it is star-like streak artifacts around the objects included in the image that typically occur.

In order to correctly image an object to be examined, it is necessary to acquire data along several projection lines, which usually in combination enclose a constant azimuth angle $\Delta\phi$, and overall, include an angle range of at least 180°. In the case of (the necessary, because it is time-saving) undersampling (i.e., $\Delta\phi > \Delta\phi_{max}$, where $\Delta\phi_{max}$ is the angular spacing that must be adhered to if a complete scanning is to be obtained), the above-mentioned streak artifacts occur outside a circular area around the point object defined by a radius (artifact radius) R. This artifact radius R and the amplitude of the streak artifacts represent the essential image quality parameters. They determine the size of the objects that can be imaged (streak-) artifact-free, and—if larger objects must be imaged—how strong the occurring artifacts will be. According to the article "Reduced Circular Field-of-View Imaging, Schefflin et al, J. of Magnetic Resonance in Medicine 40 (1998) 474-480", equation (5), R is proportional to $1/\Delta\phi$, (where, as described above, $\Delta\phi$ represents the azimuthal angular spacing of adjacent projection lines), and thus, by analogy, is proportional to the total number ($N_\phi$) of the scanned projection lines.

Other basic image quality factors, which also produce image artifacts, are "signal decay" and "eddy currents". For physical reasons (transverse and longitudinal relaxation), signal decay occurs during every scanning; they can manifest themselves differently depending on the type of tissue, the type of scanning of the k-space that is used, and the design of the excitation. With radial scanning of k-space, signal decay can either occur during the scanning of a projection line and manipulate the data of this projection line, or it can manifest itself as a different weighting between the different (adjacent) projection lines and then distort their consistency. Eddy currents are induced in conductive surfaces of the MRI device during the scanning due to the switching of the gradient fields. Such eddy currents decay with different time constants and, during this process, generate different magnetic interference fields, which then cause image interference in the image volume.

The state of the art essentially provides three methods to reduce the above-mentioned streak artifacts:

Scheffler et al (see above) use an angular range of 180° to obtain as large an artifact-free radius (R) as possible with a fixed but low number of projections $N_\phi$, because, in this manner, the azimuthal angular spacing $\Delta\phi$ is minimized. FIG. 2A shows such a 180° k-space scanning. An arrow indicates the direction of scanning of each projection line. In this example, the number of projections is $N_\phi=10$; the angular spacing $\Delta\phi$ is, generally expressed, $180°/N_\phi$, and thus, in this example, it is $\Delta\phi=18°$. In this example, the method of scanning k-space is independent of whether the number of projections is even or odd. Nevertheless, with regard to the two other aforementioned image quality factors, such a scanning of k-space results in the following problems: Firstly, the "angular increment" causes the steady state of the eddy currents between the acquisition of the last projection line of the preceding measurement and the first projection line of the subsequent measurement to be interrupted, i.e., stronger eddy-current artifacts occur. Secondly, the signal decays are not compensated for during the scanning process, which results in a strong interference with the acquisition and thus of the image quality.

A second solution is to scan an angular range of 360° with an even number of azimuthally equidistant projections. FIG. 2B illustrates such a scanning system in a simplified manner. Scanning of k-space is performed using an even number of projections $N_\phi=10$ and a 360° scanning range. Similarly as in FIG. 2A, an arrow indicates the scanning of each projection line. The arrow's direction corresponds with the readout direction. Using a simple calculation, the angular increment $\Delta\phi$ is determined to be:

$$\Delta\varphi = \frac{360°}{N\varphi} = 36°$$

First, a scanning of this type (an even number of projections) guarantees that the angular increments $\Delta\phi$ between all projection lines are identical. This symmetry results in a steady state with regard to eddy currents, i.e., all projection lines are uniformly influenced by eddy currents, and the eddy current-induced artifacts are very small. Second, due to the even number of projections to each projection line, there exists another projection line that has been acquired in exactly the opposite direction. This circumstance largely compensates for artifacts induced by a signal decay occurring during the acquisition. However, a serious disadvantage of this procedure is that, due to the double measurement (redundancy, see FIG. 2B) of each projection line, the artifacts-free radius R reaches only half of its possible value, so that those parts of the objects that are located farther from each other than R will strongly interfere with each other. In order to correctly represent the object, the number of projections would have to be substantially increased, which would proportionally (and therefore significantly) increase the measurement time.

A third solution is the radially curved procedure described in Barger et al. Time-Resolved Contrast-Enhanced Imaging with Isotropic Resolution and Broad Coverage Using an Undersampled 3D Projection Trajectory, 48, pages 297-305, 2002. As already explained, during a radial scanning procedure, data are recorded on axial straight-line sections. The measurement usually starts outside on the incoming spoke, reaches the center of k-space and continues along the outgoing spoke in the radially curved procedure, after reaching the center the direction is slightly changed. Thus, a measurement (scanning) line arises that is formed by two non-parallel spokes: an incoming spoke and an outgoing spoke. The direction is conveniently changed in such a manner that the outgoing spoke fits in the middle of two incoming spokes. In this way, the radially curved procedure circumvents the described effects (eddy currents and signal decay) by modifying the individual projections: at the point of origin of k-space, the projection lines are curved so that the second halves of the projection lines (outgoing spoke) with angles <180° fall between the first halves of the projection lines (incoming spokes) with angles >180°. However, this procedure has the great disadvantage that, upon reaching the point of origin of k-space, the gradients must be switched, discontinuously and exactly, between two digitization points in order to produce the change in orientation. A clean switchover is especially important, because it is the central, and thus contrast-determining, points of k-space that are particularly involved in this process. The difficulty of an exact switchover increases with an increasing bandwidth per pixel (measurement point in k-space) and with an increasing size of the angular increment. The latter is again proportional to the total number of projections, which means that this solution is difficult to implement in low-resolution real-time applications.

SUMMARY OF THE INVENTION

An object of the present invention is to provide a relatively fast MRI acquisition procedure, in which the aforementioned streak artifacts are minimized without increasing the influence of the other image quality factors (signal decay and eddy currents).

This object is achieved in accordance with the invention by a method for minimizing streak artifacts in modular k-space scanning in magnetic resonance imaging, including the steps of defining an odd integer k-space scanning module number $N_\phi=2n+1$ that defines the number of incrementally rotated repeated modules of the k-space scanning process, selecting, by means of a slice selection gradient, any layer in the range of the object to be examined, and acquiring data for all $N_\phi$ angle-dependent k-space scanning modules in the selected slice such that each k-space scanning module has an azimuthal distance of $$\frac{\Delta\varphi}{2} = \frac{360°}{2N_\varphi}$$

from both adjacent projections, with the direction of the scanning of the adjacent k-space scanning modules alternating.

In an embodiment of the invention, the data acquisition for all $N_\phi$ angle-dependent k-space scanning modules in the selected slice can be performed in such a way that, starting from a first k-space scanning module, data for every second (i.e. every other in the alternating sense) k-space scanning module are acquired in the same azimuthal direction.

In a further embodiment of the invention, the data for all $N_\phi$ angle-dependent k-space scanning modules in the selected slice can be acquired in such a way that, starting from a first k-space scanning module, are adjacent k-space scanning module is recorded in the same azimuthal direction.

In general, the data for all $N_\phi$ angle-dependent k-space scanning modules in the selected slice can be acquired by any combination of projection sequences.

The above object also is achieved in accordance with the invention by a method for the minimization of streak artifacts in modular k-space scanning in magnetic resonance imaging, including the steps of defining an even integer k-space scanning module number $N_\phi=2n$ that defines the number of incrementally rotated repeated modules of the k-space scanning, selecting, by means of a slice selection gradient, any layer in the range of the object to be examined, acquiring data for all $N_\phi$ angle-dependent k-space scanning modules in the selected slice such that each k-space scanning module has an azimuthal distance of $$\frac{\Delta\varphi}{2} = \frac{360°}{2N_\varphi}$$

from both adjacent projections, with the direction of the scanning of the adjacent k-space scanning modules alternating, except for any two adjacent k-space scanning modules.

The data acquisition for all $N_\phi$ angle-dependent k-space scanning modules in the selected layer is performed in such a manner that, with the same azimuthal direction, starting with a first k-space scanning module, every subsequent k-space scanning module i has an azimuthal distance $i\Delta\phi$ from the first k-space scanning module as long as $i \geq n$, and each additional k-space scanning module i has an azimuthal distance $(i-\frac{1}{2}) \Delta\phi$ from the first k-space scanning module as long as $i>n$.

Scanning of k-space according to the invention can be performed in various ways, with the k-space-scanning module is designed in different ways accordingly:

In radial, i.e., projection, k-space scanning, the k-space-scanning module consists of one line, i.e., an incoming and outgoing spoke.

In k-space scanning according to the PROPELLER technique, the k-space-scanning module consists of a bundle of parallel lines.

In spiral-type k-space scanning, the k-space-scanning module consists of a spiral arm.

The above object also is achieved in accordance with the invention by a magnetic resonance imaging device that includes a computer with which to perform the above method.

The above object also is achieved in accordance with the invention by a computer software product that implements one of the above procedures when it runs on a computer connected to the magnetic resonance imaging device.

DESCRIPTION OF THE DRAWINGS

FIG. 2A shows scanning of k-space over an angle range of 180° according to the state of the art.

FIG. 2B shows scanning of k-space over an angle range of 360° with an even number of azimuthally equidistant projections according to the state of the art.

FIG. 3C shows an advantageous variant of the inventive procedure according to FIG. 3B.

FIG. 3D shows the inventive procedure according to FIG. 3B, in a process of scanning k-space using the PROPELLER method with a space scanning module in the form of a directed bundle of parallel projection lines.

FIG. 3E shows the inventive procedure according to FIG. 3B, in a spiral-type scanning with a space scanning module in the form of a first design variant with a directed spiral arm.

FIG. 3F shows the inventive procedure according to FIG. 3B, in a spiral-type scanning with a space scanning module in the form of a second design variant with a directed spiral arm.

DESCRIPTION OF THE PREFERRED EMBODIMENTS

Figure 1:
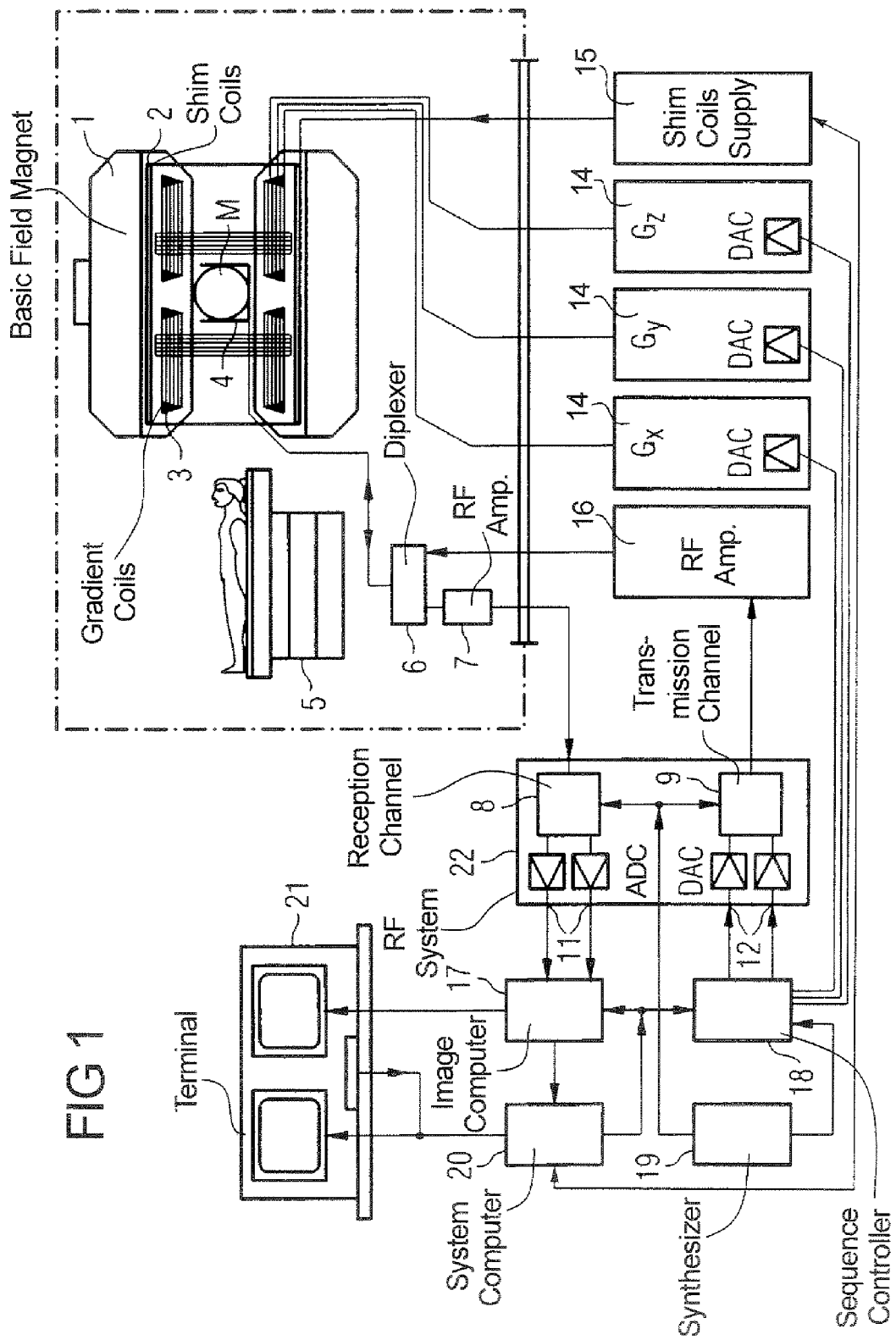
FIG. 1 substantially illustrates a magnetic resonance imaging device according to the present invention.

FIG. 1 is a schematic representation of a magnetic resonance imaging device for the production of a magnetic resonance image of an object according to the present invention. The basic design of the magnetic resonance imaging device conforms to a conventional magnetic resonance imaging device with the exceptions noted below. A basic field magnet 1 generates a temporally constant strong magnetic field in order to polarize, i.e., align the nuclear spins in the examination range of the object, such as, for example a part of a human body to be examined. For this purpose, a patient on a patient bed 5 is moveable into the basic field magnet 1. The high degree of homogeneity in the basic magnetic field required for magnetic resonance sampling is defined in a spherical sampling volume M, into which the parts of the human body to be examined are introduced. To support the homogeneity requirements and especially to eliminate temporally invariable influences, so-called shims, which are made of a ferromagnetic material, are installed at suitable locations. Temporally variable influences are eliminated by shim coils 2, which are driven by a shim power supply 15.

The basic field magnet 1 has a cylindrical gradient coil system 3 disposed therein, having three windings. Each winding is supplied with electrical current by an amplifier 14 to generate a linear gradient field in the respective directions of the Cartesian coordinate system. The first winding of the gradient field system 3 generates a gradient $G_x$ in the x direction; the second partial winding generates a gradient $G_y$ in the y direction, and the third partial winding generates a gradient $G_z$ in the z direction. Each amplifier 14 has a digital-to-analog converter, which is activated by a sequence control 18 in order to generate properly timed gradient pulses. A component of the gradient field system 3 is a radio-frequency antenna 4, which converts radio-frequency pulses generated by a radio-frequency output amplifier into an alternating magnetic field in order to excite the nuclei and cause an alignment of the nuclear spins in the object (or an area in the object) to be examined. The radio-frequency antenna 4 is formed by one or more radio-frequency transmitter coils and several radio-frequency receiver coils in the form of a preferably linear arrangement of component coils. The radio-frequency receiver coils of the high-frequency antenna 4 convert the alternating field—that arises from precessing nuclear spins and usually has the form of nuclear spin echo signals generated by a sequence of one or more high-frequency pulses and one or more gradient pulses—into a voltage, which is then fed, through an amplifier 7, to a radio-frequency receiver channel 8 of a radio-frequency system 22. The radio-frequency system 22 further has a transmit channel 9, which generates the radio-frequency pulses that excite the magnetic nuclear resonance. On the basis of a pulse sequence defined by a system computer 20, the sequence control 18 produces the radio-frequency pulses digitally as a sequence of complex numbers. This sequence of numbers is fed, in the form of real and imaginary parts, into inputs 12 of a digital-to-analog converter in the radio-frequency system 22 and from this to a converter, and then into a transmitter channel 9. In the transmitter channel 9, the pulse sequences are modulated onto a radio-frequency carrier signal whose basic frequency corresponds to the resonance frequency of the nuclear spins in the scanned volume. The signals are fed to an RF amplifier 16 that generates amplified pulse signals.

A diplexer 6 switches between the transmit to receive modes. The radio-frequency transmit coil of the radio-frequency antenna 4 emits the electromagnetic radio-frequency pulses, corresponding to the amplified pulse signals, in order to excite the nuclear spins into the scanning volume M and the high-frequency receive coils then scan the resulting echo signals. The received nuclear resonance signals are phase-sensitively demodulated in the reception channel 8 of the radio-frequency system 22 and then an analog-to-digital converter converts them into the real and imaginary part, respectively at outputs 11, of the scanned signal. From the scanned data acquired in this way, an image processor 17 reconstructs an image. The administration of the scan data, image data, and the control programs is undertaken in accordance with the invention by the system computer 20. Using a protocol determined by control programs, the sequence control 18 controls the generation of the desired sequence of pulses and the corresponding scanning of k-space in accordance with the invention. The sequence control 18 particularly controls the properly timed switching of gradients, the transmitting of radio-frequency pulses with a defined phase and amplitude, as well as the reception of magnetic resonance signals. A synthesizer 19 provides the time base for the radio-frequency system 22 and the sequence control 18. Using a terminal 21 with a keyboard and one or more monitors, the operator to select the control programs for the production of a magnetic resonance image and also displays the image.

The method for projection scanning of k-space, in accordance with the invention, uses non-curved (as opposed to the radially curved projection line method) projection lines, which can be easily realized from a technical point of view, and endeavors to achieve an azimuthally uniform, non-redundant coverage (scanning) of k-space. The actual scanning is usually performed by the integrated computer 20, i.e., the sequence control 18. The underlying principles of the invention are:

1. The covered (scanned) azimuthal range is 360°;
2. None or only a small fraction of the projection lines, i.e., "spokes", touch or cross each other (no redundancy in scanning);
3. The angle shifts between the temporally successive projections are constant or vary only slightly.

Figure 3A:
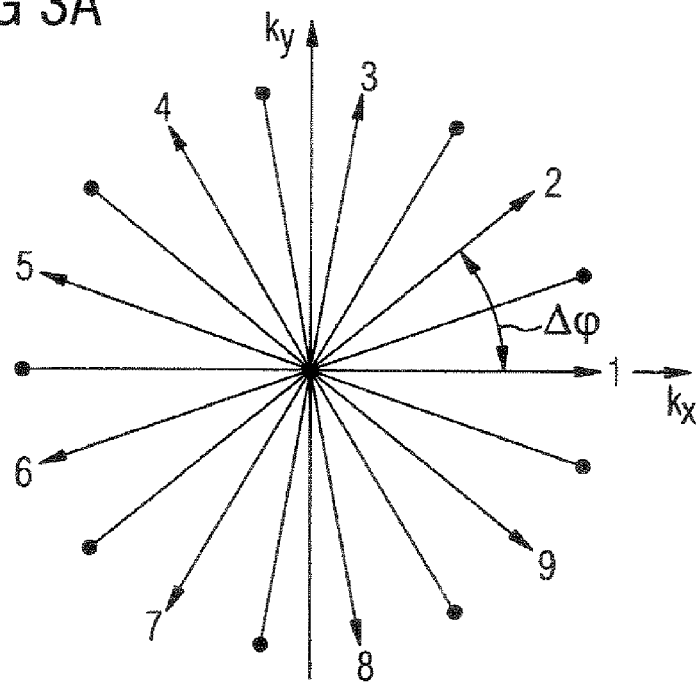
FIG. 3A shows the procedure according to the present invention, in the form of a radial, i.e., projection scanning of k-space over an angle range of 360° with an odd number of space scanning modules in the form of azimuthally equidistantly directed projection lines.

According to the invention, Points 1, 2, and 3 must be taken into consideration under all circumstances. The simplest implementation of a projection scanning process with respect to Points 1 to 3 is the scanning of an angle rage of 360° with an odd number of azimuthally equidistant projection lines as shown in FIG. 3A. FIG. 3A shows the number of projections $N_\phi=9$, which is an odd number. Thus, a uniform 360° angle scanning is performed with an angular increment of $$\Delta\varphi = \frac{360°}{N_\varphi} = \frac{360°}{9} = 40°.$$

Thus, the scanning trajectory is in the form of a star-shaped structure, which can be observed in the k-space in relation to a Cartesian coordinate system (abscissa $k_x$, ordinate $k_y$). The center of the star (i.e., the intersection of all projection lines of the slice to be acquired) lies in the point of origin of the coordinate system. Each projection line is characterized by its direction (of scanning) (directed projection line), which is defined by the MRI device and marked by an arrow. A comparison of the direction of two adjacent projection lines occurs in that, by azimuthally turning one of the two projection lines, the two projection lines to be compared are superimposed on each other (cover each other, are congruent), and this is done so that, during the turning process, the angular increment $$\Delta\varphi = \frac{360°}{N_\varphi}$$

is not exceeded. If the arrows of the two (now congruent) directed projection lines point in opposite directions, the lines are called non-rectified.

If the arrows of the two directed projection lines point in the same directions, the lines are called rectified. Thus, an alternating scanning direction means that the direction of adjacent projection lines changes.

In general, the azimuthal and equidistant gap $\Delta\phi$ between two adjacent odd-numbered projection lines of a similar direction is defined by $$\Delta\varphi = \frac{360°}{2n+1} \quad (1)$$

with $N_\phi=2n+1$ as the total of all projection lines. All $N_\phi$ angle-dependent projection lines in the selected slice are acquired in such a manner that each projection line has an azimuthal distance $$\frac{\Delta\varphi}{2} = \frac{360°}{2N_\varphi}$$

from the two adjacent projection lines. The scanning direction of adjacent directed projection lines alternates, which is illustrated in FIG. 3A by means of the aforementioned arrows. An arrow represents a projection line; the direction of the arrow defines the direction of scanning. All projection lines have an equal distance of $\Delta\phi/2$ from each other.

A summary of the most important relations (FIG. 3A):
the undirected projection lines have an azimuthal distance of $\Delta\phi/2$ from each other;
the directed projection lines of the same or similar direction have an azimuthal distance of $\Delta\phi$ from each other;
the azimuthal neighbors of a certain directed projection line g are two directed projection lines in a direction (almost) opposite to g, wherein both have an azimuthal angle distance of $\Delta\phi/2$ from g.

The temporal sequence of projections, i.e., the order in which the projection lines are scanned (measured), can be designed in different ways. A first variant is, for example,
0, $\Delta\phi$, 2 $\Delta\phi$, 3 $\Delta\phi$, ..., n$\Delta\phi$, (n+1) $\Delta\phi$, ..., 2n$\Delta\phi$,(2n+1) $\Delta\phi$ with a cyclical continuation. In this variant, all $N_o$ projections are recorded in such a manner that, starting from a first directed projection line, only every second directed projection line in the same azimuthal direction is recorded. In this way, the successively recorded projection lines have the same direction of arrows and thus are scanned in the same direction.

Another possible variant is
0, (n+1) $\Delta\phi$, $\Delta\phi$, (n+2) $\Delta\phi$,2n$\Delta\phi$, (n+3) $\Delta\phi$, ..., (n−1) $\Delta\phi$, 2n $\Delta\phi$, n$\Delta\phi$, (2n+1) $\Delta\phi$with a cyclical continuation. In this variant, all $N_\phi$ projections are recorded in such a manner that, starting from a first directed projection line, every adjacent directed projection line in the same azimuthal direction is recorded. The scanning alternates, because they are directly adjacent to the directed projection lines, have arrows in the opposite direction.

There are other possible azimuthal angular increments sequences that can be used and that are not detailed here.

In another—although somewhat less than optimal—variant, according to Point 3, after half of the total even and odd-numbered projections N$\phi$=2n, the azimuthal angular increment is shifted by ½ $\Delta\phi$:

$$\Delta\varphi = \frac{360°}{2n} \quad (2)$$

with the total number of projections equal to 2n.
Thus the following relations apply:
for i≤n: $\phi_i$=l$\Delta\phi$
for i>n: $\phi_i$=(l−½)$\Delta\phi$ This type of recording allows scanning of the selected slice in azimuthally equidistant steps. However, the even number of projections requires the one-time angular increment ½ $\Delta\phi$, which results in a situation where, of all projection lines, the direction of scanning of two adjacent directed projection lines is the same or similar, with the associated disadvantages regarding the signal decay and eddy currents.

Figure 3B:
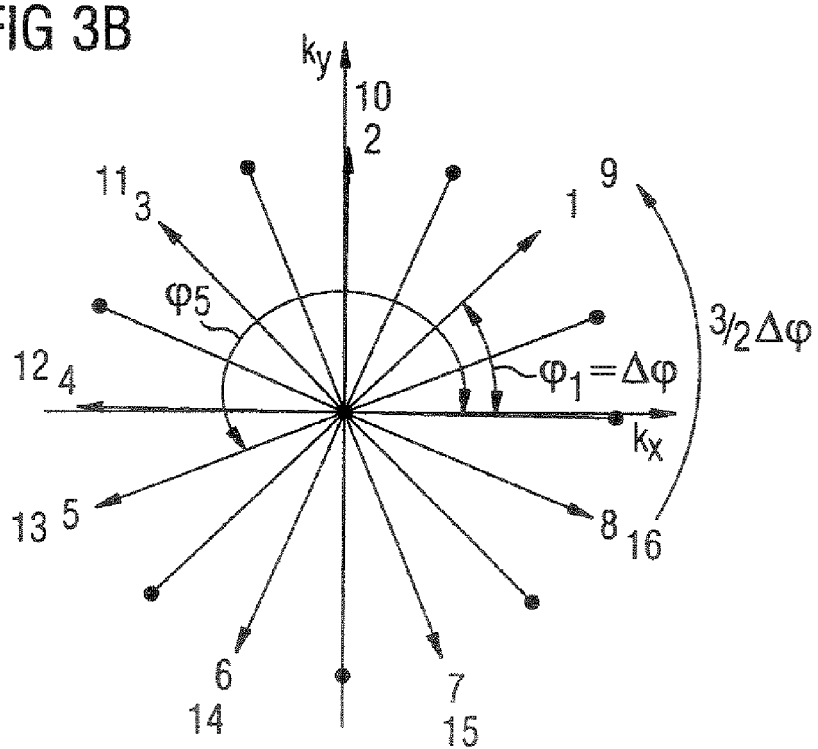
FIG. 3B shows the procedure according to the present invention, in the form of a radial, i.e., projection, scanning of k-space over an angle range of 360° with an even number of space scanning modules in the form of azimuthally equidistantly directed projection lines.
Figure 4:
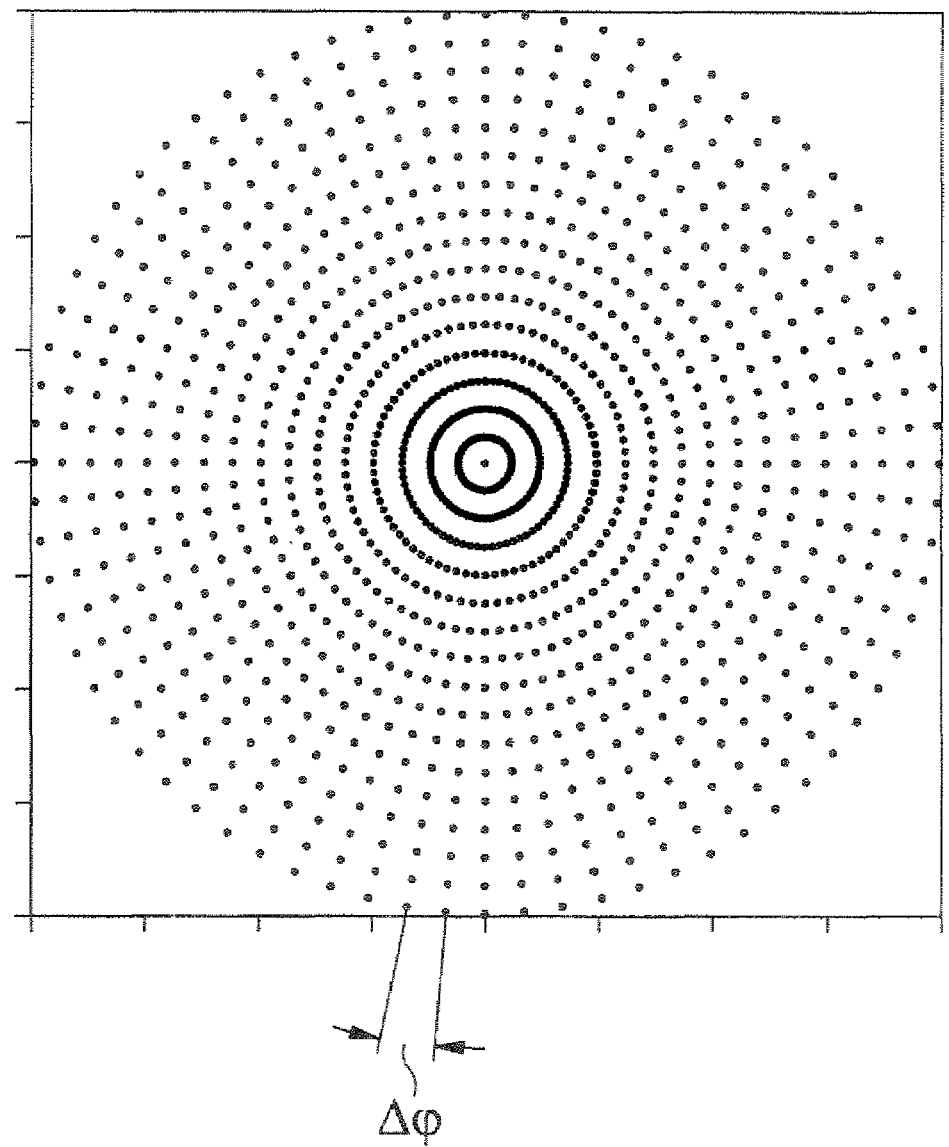
FIG. 4 shows a typical data set for projection reconstruction in k-space (projection data set).

FIG. 3B illustrates this variant for n=4, i.e., for a total of $N_\phi$=2n=8 projections. The first (i=1) azimuthal angular increment $\phi_1$ is $$\Delta\varphi = \frac{360°}{2\times 4} = 45°,$$

when measured from the $k_x$ axis (0°). The second (i=2) azimuthal angular increment $\phi_2$ is 2$\Delta\phi$=90°, the third (i=3) azimuthal angular increment $\phi_3$ is 3$\Delta\phi$=135°, and the fourth (i=4) azimuthal angular increment $\phi_4$ is 4$\Delta\phi$=180°. The next projection i=5 is greater than n=4, which is why, according to the invention, a one-time angular increment of ½$\Delta\phi$ is introduced with the corresponding azimuthal angular increment of $\phi_5$=(5−½) $\Delta\phi$=202.5°. All other azimuthal angular increments of subsequent projections are calculated using the algorithm described above.

A disadvantage of this method of scanning k-space is that the periodical continuation of the scanning design according to FIG. 3b involves a relatively great angular increment ³⁄₂ϕ (see the azimuthal distance of projection lines 8 and 9). A periodical continuation consists either in a temporal scanning sequence of the same layer or in a temporal scanning sequence of adjacent parallel layers (so to speak, from image to image). Such an angular increment can be reduced, for example, between the acquisition of successive images (layers), the scanning design can be turned azimuthally by +Δϕ)/2 or −Δϕ/2. This adjustment exchanges the incoming and outgoing "spokes" between successive images. A scanning design so modified is shown in FIG. 3c, where the directed projection lines 1 to 8 pertain to the first image, and the directed projection lines 8 to 17 pertain to the second image, etc.

Another disadvantage of k-space scanning procedure according to FIGS. 3B and 3C is that two of all the adjacent projections have the same direction and, therefore, it is not possible to compensate completely for the signal delay. In general, other variants of the described scanning designs are conceivable and possible, as long as the pre-requisites indicated under Points 1, 2, and 3 are adhered to. If an angular range of 360° is scanned according to the first two variants described above, i.e., with an odd number of projections (See FIG. 3a), an optimal compromise can be found with regard to image quality:

By comparison with a process of scanning 360° with an even number of projections, the artifacts, depending on the number of projections (projection number artifacts) and occurring outside the radius R, are substantially reduced, because a redundant (double) scanning of the projections has been avoided.

Moreover, the compensation of the signal delay is largely retained, because the azimuthally adjacent projections are acquired in approximately opposite directions. In addition, the steady state of eddy currents is not interrupted, which is why, in general, eddy-current artifacts are avoided.

The described, advantages also apply to the above-mentioned procedure according to Point 3 with a one-time angular increment; however, due to the increment, in this case the advantages are not so pronounced. According to the invention, the described designs of optimal projection-based scanning processes can be combined with other optimal data acquisition designs. For example, it would be possible to combine this procedure with the described "radially curved procedure", which would achieve a quadrupling of the azimuthal distance density (sampling density).

The above-described method according to the invention has been described and illustrated, in a detailed manner, for radial, i.e., projection-based scanning of k-space. However, in a very general manner, the method of the invention can be applied to all scanning procedure in which a so-called k-space scanning module—consisting of a contiguous area of the k-space—is repeated in a slightly rotated position. In the described radial procedure, i.e., projection-based k-space scanning, this k-space-scanning module is represented by one line, i.e., an incoming and an outgoing spoke. In the so-called PROPELLER procedure (J. G. Pipe, Motion Correction with PROPELLER MRI: Application to head motion and free-breathing cardiac imaging, Journal of Magnetic Resonance in medicine 42 (1999) 963-968), such a k-space module consists of a directed bundle of parallel k-space lines with a different k-space encoding. The central axis of the bundle intersects the center of the k-space, as is shown in FIG. 3d for the case of 4 k-space scanning modules. The direction of the bundles is indicated by an arrow and is defined by the direction of the scanning of the particular bundle.

In spiral-type k-space scanning, the k-space-scanning module consists of a so-called spiral arm. The spiral arm can be a simple spiral (FIG. 3E) or it can be designed as a centrosymmetrical complement to the same simple spiral as a double spiral centrosymmetrical to the k-space point of origin (FIG. 3F). From the point of view of the scanning technique, the simple spiral can run from the k-space origin to its outer end, or, vice versa, from its outer end to the k-space origin. The scanning of the centrosymmetrical double spiral starts at one of its outer ends, passes the k-space origin, and ends at the opposite outer end. By connecting the starting point and the ending point of the scanning with a vector arrow, we can assign a direction to any spiral. Within the context of the invention, in this manner, every spiral arm (both in the form of a simple spiral and in the form of a double spiral) can be considered to be a k-space scanning module which, that, due to the vector arrow, has a direction in the selected layer of k-space and that also azimuthally occupies an unambiguous position. A sequence of several spiral arms according to the invention, (an odd or even number) produces a k-space trajectory and scans the k-space slice in a manner that—similarly to the radial projection-based k-space scanning as to the invention—has a minimized sensitivity to physical interference effects (signal decay, eddy currents).

It should be noted that even in the radial projection-based k-space scanning, the k-space scanning module need not necessarily be symmetrical to the origin (as the simple spiral in spiral-type k-space scanning). For example, the k-space-scanning module may contain only a part of a spoke or bundle.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for minimizing streak artifacts in modular k-space scanning in magnetic resonance imaging, comprising the steps of:
    defining an odd integer k-space scanning module number $N\phi=2n+1$ that defines a number of incrementally rotated, repeated modules for scanning k-space;
    selecting, with a slice selection gradient, a slice in a volume of an object to be examined;
    acquiring data for all Nϕ angle dependent k-space scanning modules in the selected slice so that each k-space scanning module has an azimuthal distance of
    $\Delta\phi/2=360$ degrees/$2N\phi$ from both projections adjacent thereto, by scanning each of said scanning modules in a vectorally unidirectional assigned scanning direction and alternating the vectorally unidirectional assigned scanning direction of adjacent k-space scanning modules; and
    reconstructing an image from the acquired data with streak artifacts minimized therein.

2. A method as claimed in claim 1 comprising acquiring said data for all $N_\phi$ angle-dependent k-space scanning modules in the selected slice by, starting from a first k-space scanning module, acquiring data for every second k-space scanning module in a same azimuthal direction.

3. A method as claimed in claim 1 comprising acquiring said data for all $N_\phi$ angle-dependent k-space scanning modules in the selected slice by, starting from a first k-space scanning module, acquiring data for every adjacent k-space scanning module in a same azimuthal direction.

4. A method as claimed in claim 1 wherein the step of acquiring said data for all $N_\phi$ angle-dependent k-space scanning modules in the selected slice in an arbitrary combination of projection sequences.

5. A method as claimed in claim 1 comprising, in radial k-space scanning, employing a k-space scanning module consisting of one line formed by an incoming spoke and an outgoing spoke.

6. A method as claimed in claim 1 comprising scanning k-space in a PROPELLER procedure, and using a k-space scanning module consisting of a bundle of parallel lines.

7. A method as claimed in claim 1 comprising scanning k-space in a spiral scanning procedure, and employing a k-space scanning module consisting of a spiral arm.

8. A magnetic resonance imaging apparatus comprising:
a magnetic resonance scanner configured to receive an examination subject therein in order to obtain magnetic resonance signals, representing raw data, from the subject by executing an imaging sequence comprised of radio-frequency pulses and gradient pulses; and
a computer configuration that operates said scanner and that is configured for entering said raw data as data entries in k-space, and configured for scanning k-space by defining an odd integer k-space scanning module number $N\phi=2n+1$ that defines a number of incrementally rotated, repeated modules in a k-space scanning procedure, and for activating at least one radio-frequency pulse and a slice selection gradient that selects a slice of the examination subject from which said raw data are to be acquired, and configured for operating said scanner in order to acquire said raw data for all $N\phi$ angle-oriented k-space scanning modules in the selected slice by defining an azimuthal distance, of each k-space scanning module, of $\Delta\phi/2 = 360$ degrees/$2N\phi$ from both adjacent projections, by scanning each of said scanning modules in a vectorally unidirectional assigned scanning direction, while alternating the vectorally unidirectional assigned scanning direction of adjacent k-space scanning modules, and configured to reconstruct an image from the acquired data with streak artifacts minimized therein.

9. A computer-readable medium encoded with a data structure and loadable into a control computer of a magnetic resonance apparatus for minimizing streak artifacts in modular k-space scanning, said data structure causing said computer to:
define an odd integer k-space scanning module number $N\phi=2n+1$ that defines a number of incrementally rotated, repeated modules for scanning k-space;
select, with a slice selection gradient, a slice in a volume of an object to be examined;
acquire data for all $N\phi$ angle-dependent k-space scanning modules in the selected slice so that each k-space scanning module has an azimuthal distance of $\Delta\phi/2=360$ degrees/$2N\phi$ from both projections adjacent thereto, by scanning each of said scanning modules in a vectorally unidirectional assigned scanning direction, while alternating the vectorally unidirectional assigned scanning direction of adjacent k-space scanning modules; and
reconstruct an image from the acquired data with streak artifacts minimized therein.

\* \* \* \* \*